United States Patent [19]
Gates

[11] Patent Number: 5,875,096
[45] Date of Patent: Feb. 23, 1999

[54] APPARATUS FOR HEATING AND COOLING AN ELECTRONIC DEVICE

[75] Inventor: Frank Vernon Gates, Roxbury, N.J.

[73] Assignee: AT&T Corp., Middletown, N.J.

[21] Appl. No.: 775,915

[22] Filed: Jan. 2, 1997

[51] Int. Cl.⁶ .................................................. H05K 7/20
[52] U.S. Cl. ...................... 361/704; 165/80.3; 174/16.3; 257/718
[58] Field of Search .................................. 165/80.2, 80.3, 165/185; 174/16.3; 257/706, 707, 712, 713, 718, 719; 361/690, 704, 705, 707–708, 710, 715

[56] References Cited

U.S. PATENT DOCUMENTS

| | | |
|---|---|---|
| 4,402,185 | 9/1983 | Perchak . |
| 4,629,114 | 12/1986 | Baker . |
| 4,748,495 | 5/1988 | Kucharek . |
| 4,792,878 | 12/1988 | Buselmeier et al. . |
| 4,821,147 | 4/1989 | Jacobs et al. ............................ 361/388 |
| 5,451,747 | 9/1995 | Sullivan et al. . |
| 5,463,874 | 11/1995 | Farr . |
| 5,537,834 | 7/1996 | Farr . |
| 5,552,961 | 9/1996 | Van Gaal et al. ....................... 361/700 |

FOREIGN PATENT DOCUMENTS

| | | | |
|---|---|---|---|
| 1239998 | 9/1989 | Japan | ..................................... 361/704 |
| 6163758 | 6/1994 | Japan | ..................................... 257/718 |

Primary Examiner—Gregory Thompson

[57] ABSTRACT

A method and apparatus maintain the operating temperature of an electronic device within an acceptable operating range for a wide range of ambient temperatures. The apparatus includes a heat sink and a temperature dependent loading device which brings the heat sink into thermal contact with the electronic device when the ambient temperature exceeds a threshold level.

22 Claims, 3 Drawing Sheets

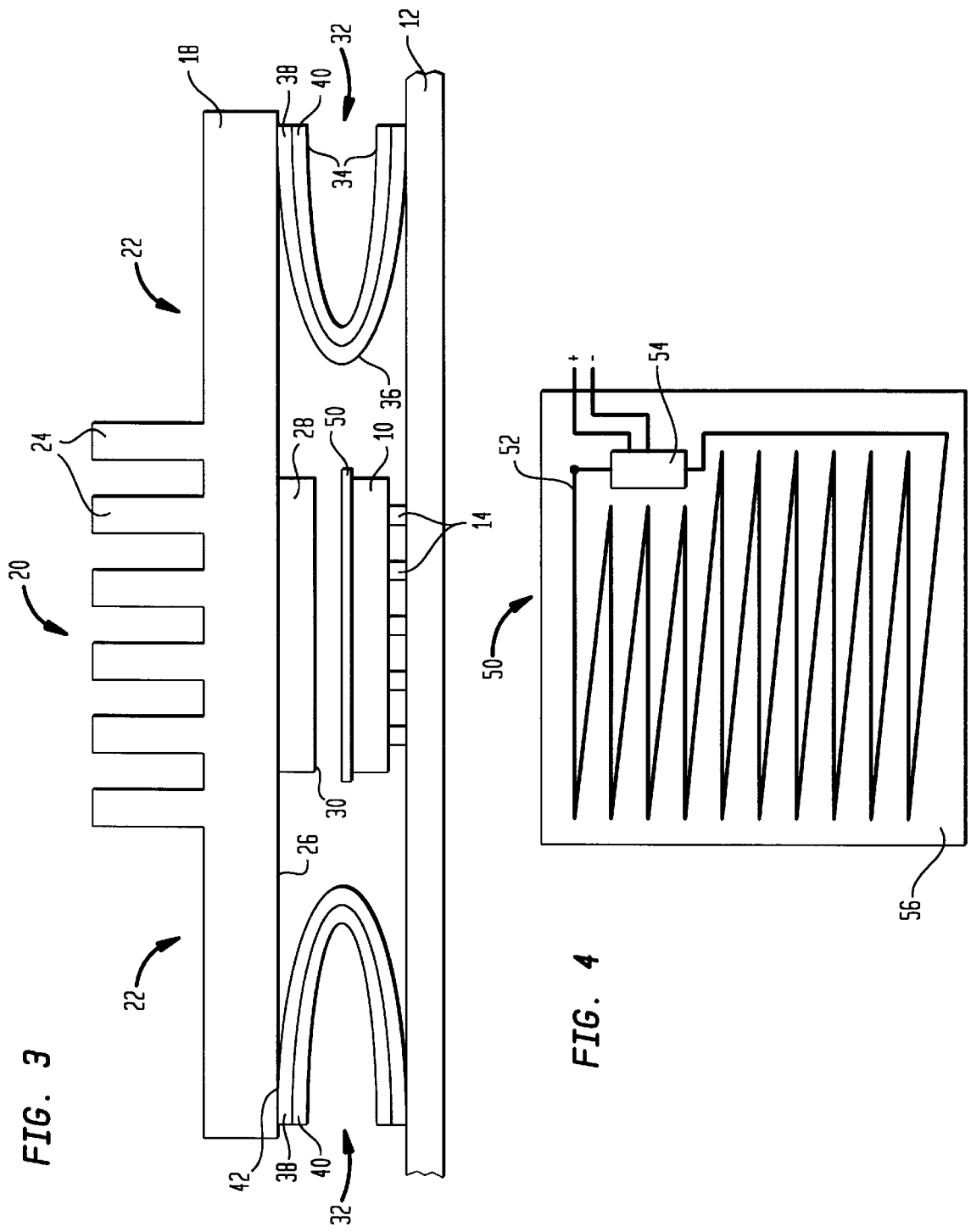

APPARATUS FOR HEATING AND COOLING AN ELECTRONIC DEVICE

FIELD OF THE INVENTION

The invention relates to regulating the temperature of an electronic device, and specifically to heating and cooling an electronic device having a substantially planar upper surface by selectively thermally engaging the electronic device with a heat sink and a heat pad.

BACKGROUND OF THE INVENTION

Electronic devices, including integrated circuits, must be maintained during operations at a temperature within an operating range of temperature specified by the manufacturer of the electronic device to operate properly. In the case of commercially available integrated circuits, typically the range of temperatures is between 0 deg. and 70 deg. Celsius. When implementing an electronic device in a given system, for example on a printed circuit board within a computer system, features must be included to maintain the electronic device at temperatures within the operating range of the electronic device.

Typically, because electronic devices produce heat as a by-product of operation, electronic devices must be cooled. Fans and heat sinks have been used to cool electronic devices and maintain them within the specified operating range. Fans and heat sinks work well when implemented in an environment with narrow temperature limits such as the home. However, when temperature extremes of the environment can vary widely, devices for regulating the operating temperature of the electronic device must be made more complex, and have to both heat and cool the electronic device. Heat sinks in intimate contact with the electronic device tend to shift the operating range of the electronic device downward for a given ambient temperature. Therefore, with a heat sink alone, both the upper range and lower range of acceptable ambient temperatures in which the electronic device can operate within its operating range are raised, making heat sinks alone unsuitable for cold environments. Fans are likewise unsuitable and moreover, tend to be costly and prone to failure.

SUMMARY OF THE INVENTION

In accordance with the present invention, a method and apparatus are introduced for maintaining the operating temperature of an electronic device within an acceptable range for the device. The apparatus regulates the temperature of an electronic device rigidly attached to a base and includes a heat sink having a planar surface. A temperature dependent loading device is attached to the heat sink and the base and holds the heat sink at a distance away from the electronic device. The temperature dependent loading device forces the heat sink toward the electronic device as the temperature increases, so that when the temperature exceeds a threshold the heat sink thermally contacts the integrated circuit, thus cooling it.

The method regulates the temperature of an electronic device, and includes supporting a heat sink at a distance away from an integrated circuit, reducing the distance until the heat sink thermally contacts the electronic device above a threshold temperature, and increasing the height until the heat sink thermally disengages the electronic device below a threshold temperature. In a preferred method, the electronic device is heated when the temperature drops below a threshold temperature.

BRIEF DESCRIPTION OF THE DRAWINGS

These and other objects, features, and advantages will be more fully appreciated with reference to the accompanying drawings.

FIG. 3 depicts an embodiment of the present invention, further comprising a heat pad.

FIG. 4 depicts elements of the heat pad according to a preferred embodiment of the present invention.

DETAILED DESCRIPTION OF THE INVENTION

Figure 1:
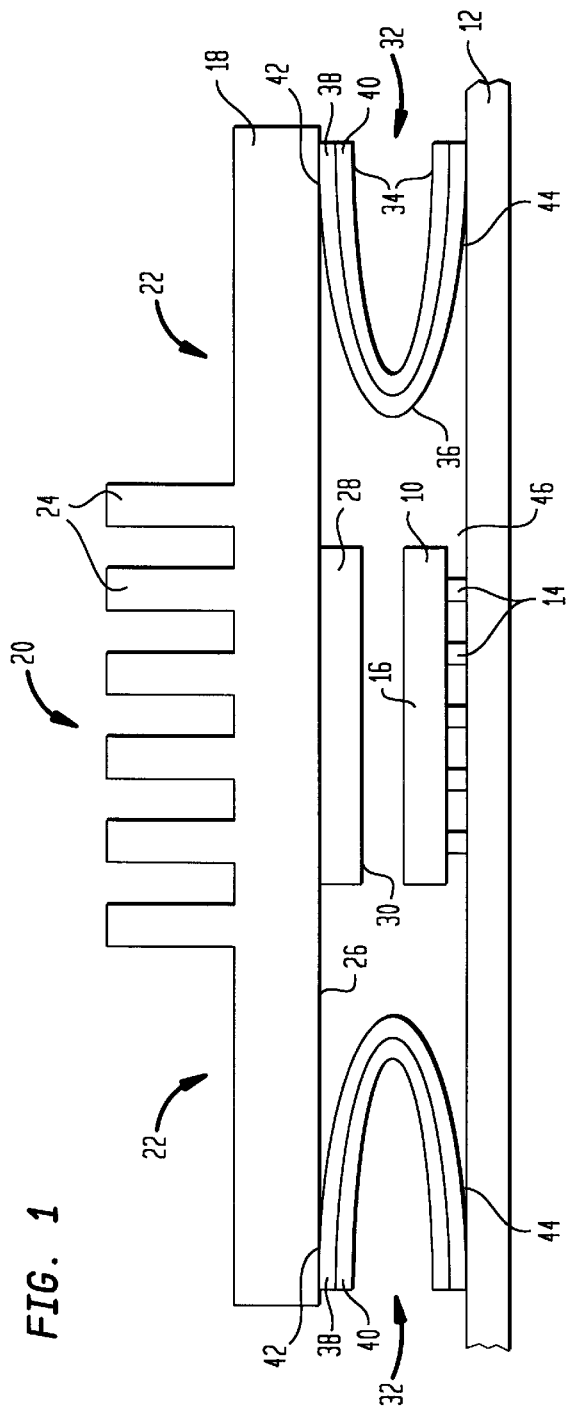
FIG. 1 depicts a preferred embodiment illustrating the heat sink elevated above an electronic device with bi-metallic strips.

A preferred embodiment of the invention is depicted in FIG. 1. An electronic device, for example an integrated circuit 10, is connected to a base, for example a printed circuit board (PCB) 12. The integrated circuit 10 contains electrical contacts 14 that are coupled to mating contacts on the PCB 12. Any method of packaging the integrated circuit 10 and attaching the integrated circuit 10 to the PCB 12 may be employed, as long as the integrated circuit 10 either presents a substantially planar upper surface 16 or is thermally coupled to a substantially planar upper surface 16. Attachment of the integrated circuit 10 to the PCB 12 may be done directly by techniques including flip-chip, surface mount technology, and tape automated bonding (TAB). Preferably, however, the integrated circuit 10 is attached to a package which is in turn attached to the PCB 12. Examples of such packages include dual in-line packages (DIPS), quad flat packs, single chip modules, and multi-chip modules.

The PCB 12 includes electrical conductors coupled to the electrical contacts 14 on the PCB which supply power and electrical signals stimulating the integrated circuit 10 to perform its intended function. The PCB 12 may also contain one or more other integrated circuits 10, electronic devices, discrete logic and, facility for connection to other printed circuit boards and peripheral devices such as a monitor. As the integrated circuit 10 performs its intended function, it produces heat as a by-product of the electrical processes occurring thereon. The heat produced by the integrated circuit 10 raises the temperature of the integrated circuit 10. The integrated circuit 10 is in thermal contact with the printed circuit board 12 and the air above the substantially planar upper surface 16. Therefore, the ambient temperature of the air and the temperature of the PCB 12 affect the temperature of the integrated circuit 10.

A heat sink 18 is disposed above the integrated circuit 10. The heat sink 18 has a finned portion 20 and unfinned portions 22. The finned portion 20 includes fins 24 integrally formed with the heat sink 18, the height, width, and pitch of the fins 24 being selected to provide a given rate of cooling. The fins 24 increase the surface area of the heat sink and therefore increase the effective heat transfer to surrounding air by convection. Heat sinks of the variety described are well known in the art and are readily available.

FIG. 1 depicts the heat sink 18 has a substantially planar lower surface 26 disposed above the substantially planar upper surface 16 of the integrated circuit 10. In a preferred embodiment of the invention a thermally conductive, compressible material is disposed against the lower surface 26 of the heat sink 18. This may be implemented with an elastomeric pad 28 mounted with an adhesive to the lower surface 26 of the heat sink 18. Preferably, the elastomeric pad 28 is 5 to 10 mils thick and has a lower surface 30 with dimensions similar to the upper surface 16 of the integrated circuit 10. The elastomeric pad 28 compensates for surface roughness of the heat sink 18 and the integrated circuit 10, therefore creating better thermal conductivity between the integrated circuit 10 and the heat sink 18.

The heat sink 18 is held in place above the integrated circuit by a temperature dependent loading device. In a preferred embodiment, the temperature dependent loading device is bi-metallic strips 32. Each bi-metallic strip 32 has end portions 34 and a curved portion 36 between the end portions 34. The bi-metallic strips 32 are attached at the end portions 34 to the lower surface 26 of the heat sink 18 and to the PCB 12. Attachment is preferably done by riveting or by other conventional techniques including welding, gluing, screwing, and clamping.

Each bi-metallic strip 32 is comprised of strips of two thin, substantially rectangular pieces of different materials that are laminated together. The different materials must have different coefficients of thermal expansion. Bi-metallic strips are well known in the art. The bi-metallic strips 32 are then bent to form the curved portion 36 and the end portions 34. The bi-metallic strips 32 are bent so that the material with the higher coefficient of thermal expansion is on the outside of the curved portion 36. As the ambient temperature increases, the outside strip 38 elongates at a faster rate than the inside strip 40, thus reducing the radius of curvature. Conversely, as the ambient temperature decreases, the outside strip 38 shrinks in length at a faster rate than the inside strip 40, thus reducing the radius of curvature of the curved portion 36.

As the radius of curvature of the curved portion 36 decreases, the height of the heat sink 18 above the integrated circuit 10 decreases until the foam pad 28 contacts the upper surface 16 of the integrated circuit 10. The radius of curvature of the bi-metallic strips 32 and the materials chosen to implement the individual strips 38 and 40 must be chosen so that heat sink 18 is brought into contact with the integrated circuit 10 when the temperature of the bi-metallic strip 32 exceeds a threshold level. Similarly, the above parameters must be chosen so that the heat sink 18 is brought out of thermal contact with the integrated circuit 10 below a certain ambient temperature.

The bi-metallic strips 32 present thermal interfaces 42 and 44 to the heat sink 18 and the PCB 12, respectively. The interfaces 42 and 44 can be made thermally conductive or thermally insulative in order to make the temperature of the bi-metallic strips 32 track the temperature of the heat-sink 18 or the PCB 12. For example, if the interfaces 42 between the heat sink 18 and the bi-metallic strip 32 are made thermally conductive, while the interfaces 44 between the bi-metallic strips 32 and the PCB 12 are made thermally insulative, the temperature of the bi-metallic strips 32 will tend to always be close to the heat sink 18. If the bi-metallic strip 32 is thermally non-conductive at both interfaces 42 and 44, the bi-metallic strip will tend to track the ambient temperature of the air. Similarly, if the interfaces 42 are made thermally insulative and the interfaces 44 are made thermally conductive, the temperature of the bi-metallic strip will tend to track the temperature of the PCB 12. In an alternate embodiment of the invention, a thermally conductive path is created between the interface 46 between the integrated circuit 10 and the PCB 12. In addition, thermally conductive paths are created on the PCB 12 between the interfaces 46 and 44, and at interface 44 itself. Thus, a thermally conductive path is established between the integrated circuit 10 and the bi-metallic strip 32, which will tend to track the temperature of the integrated circuit 10, particularly if interface 42 is made thermally insulative.

Figure 2:
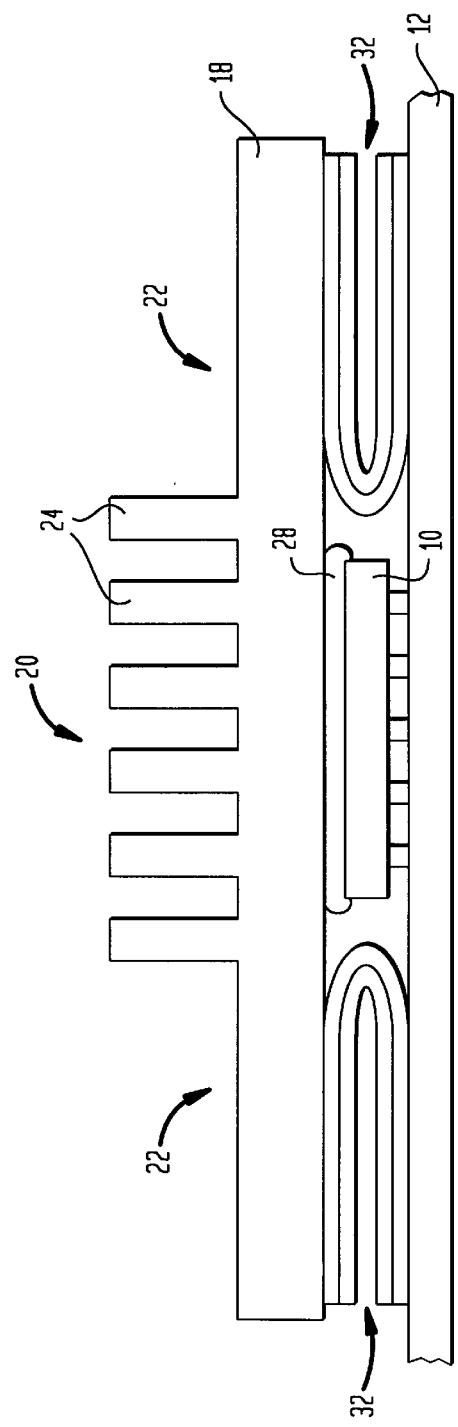
FIG. 2 depicts the embodiment of FIG. 1, in which the heat sink 18 has been brought into thermal contact with the electronic device.

FIG. 2 illustrates the embodiment of the invention depicted in FIG. 1, wherein the radius of curvature of the curved portion 36 of the bi-metallic strips 32 has been reduced so that the elastomeric pad 28 contacts the upper surface 16 of the integrated circuit 10. The ability to selectively bring the heat sink 18 into thermal contact with the integrated circuit 10 above a threshold temperature extends the ambient temperature range over which the integrated circuit 10 can operate. Particularly, the integrated circuit 10 can operate in this configuration at lower temperatures than would be possible by implementing the integrated circuit 10 with a permanently attached heat sink 18.

FIG. 3 illustrates a preferred embodiment of the present invention, which further includes a heat pad 50, attached to the upper surface 16 of the integrated circuit 10. The heat pad 10 may be implemented with the commercially available and well known Kapton heater. In a preferred embodiment of the invention, the heat pad 10 is substantially planar in the x, y directions and very thin in the z dimension, between 0.5 to 2.0 mils and preferably 1 mil, in order to maintain good thermal conductivity through the heat pad 50 when the heat pad is not heating. Attachment of the heat pad 50 to the integrated circuit 16 is accomplished for example by gluing with a thermally conductive glue or resin.

The heat pad 50, shown in FIG. 4, includes a conductive element 52 encased within an electrically non-conductive material. The conductive element 52 is arranged so that its surface area covers almost the entire x,y plane area of the heat pad 50. The arrangement of the conductive element 52 is for example, a serpentine pattern as shown in FIG. 4. The conductive element 52 has ends for connection to a temperature sensor 54. In a preferred embodiment of the invention, the temperature sensor 54 is included within the heat pad 50. However, the temperature sensor 54 may be located remotely, including on the PCB 12 or on the heat sink 18. The temperature sensor 54 is coupled to the conductive element 52 and supplies a voltage across the conductive element 52, when the temperature drops below a predetermined threshold, causing current to flow through the conductive element 52 thus producing resistive heat. The heat pad 50, therefore, supplies heat to the integrated circuit 10 when the ambient temperature is cold in order to boost the temperature of the integrated circuit 10 and maintain it within the operating range of the integrated circuit 10.

The electrically non-conductive material 56 in which the conductive element 52 lies is preferably plastic, but may be any material that conducts heat but is not a good electrical conductor. The electrically non-conductive material may be integrally formed around the conductive element 52 for example using a molding process. Conversely, the electrically non-conductive material 56 may include a pair of substantially planar pads each having an inner surface against which the conductive element 52 is disposed. The pair of substantially planar pads may then be attached together, for example with glue, by melting, or by ultrasonic welding.

Figure 5:
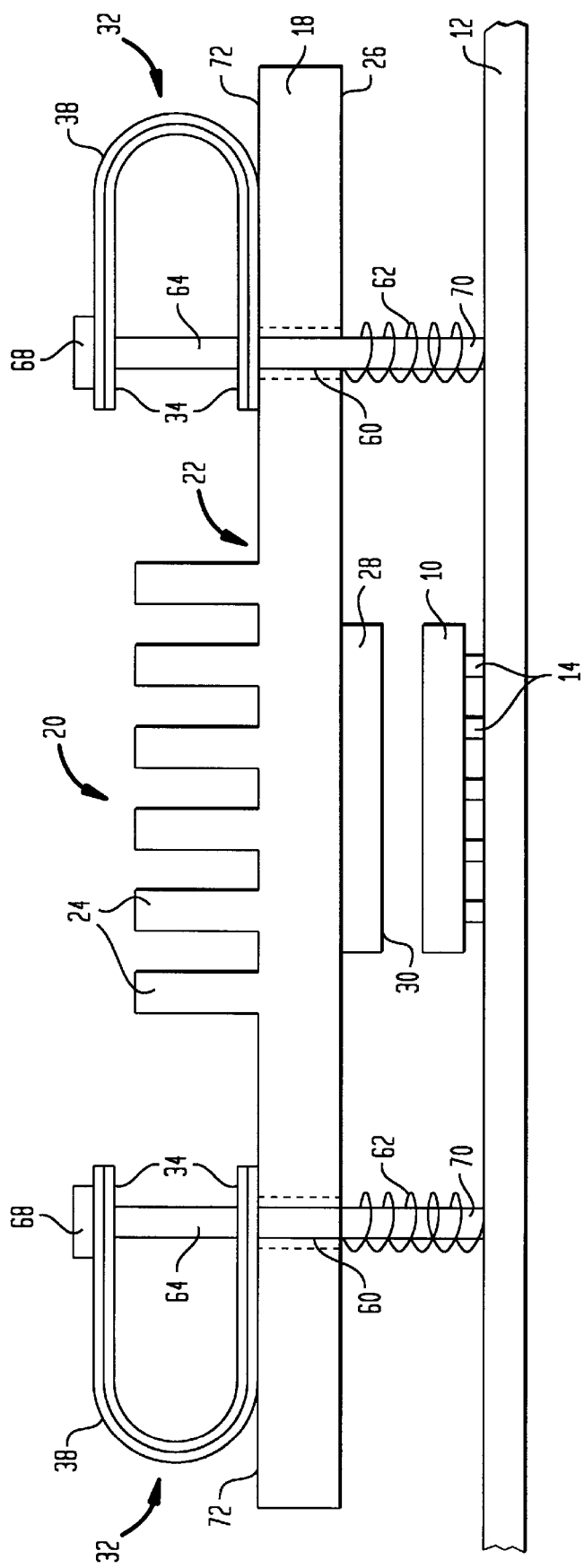
FIG. 5 depicts an alternate embodiment of the present invention, further comprising a pin and a spring for controlling the height of the heat sink above an electronic device.

FIG. 5 shows an alternate embodiment of the invention, in which the heat sink 18 has a hole 60 drilled or formed in an unfinned portion 22. A spring 62 has a longitudinal axis and is disposed against the lower surface 26 of the heat sink 18. The longitudinal axis of the spring 62 is substantially collinear with the central axis of the hole 60, and the spring 62 is disposed between the heat sink 18 and the PCB 12. The spring 62 applies compressive force to the heat sink 18 and tends to force the heat sink 18 away from the upper surface 16 of the integrated circuit 10.

A pin 64, has an upper end 68 and a lower end 70. The pin 64 is disposed within the hole 60 and the spring 62, so that the pin 64 is substantially collinear with the central axis of the hole 60 and the longitudinal axis of the spring 62. The lower end 70 of the pin 64 is connected to the PCB 12. Connection is accomplished by many techniques including by forming a hole in the PCB 12 and plating metal between the pin 64 and the hole, or by connecting the pin 64 to a bracke to the PCB to the PCB 12.

Attached to the upper end 68 of the pin 64 is one end 34 of a bi-metallic strip 32. The other end 34 of the bi-metallic strip 32 is disposed against the upper surface 72 of the unfinned portion 22 of the heat sink 18. In a preferred embodiment of the invention, the upper end 68 terminates as a bulbous region. The bi-metallic strip 32 has holes formed at each of the ends 34 and the pin 64 is disposed within the holes of the bi-metallic strip 32. The bi-metallic strip 32 exerts force on the upper end 68 of the pin 64 and the upper surface 72 of the heat sink 18.

The inside strip 40 of the bi-metallic strip 32 has a higher coefficient of thermal expansion than the outside strip 38. Therefore, unlike the embodiment depicted in FIGS. 1–3, as the temperature increases, the inside strip 40 expands in length faster than the outside strip 38 thus increasing the radius of the curved portion 36. This causes the bi-metallic strip 32 to exert downward force against the upper surface 72 of the heat sink 18 and tends to compress the spring 62. The materials used to implement the strips 38 and 40 of the bi-metallic strip 32, and the spring constant of the spring 62 should be chosen so that above a certain threshold temperature, the lower surface 30 of the elastomeric pad 28 contacts the upper surface 16 of the integrated circuit 10. Conversely, as the temperature drops below the threshold temperature, the spring 62 must overcome the compressive force of the bi-metallic strip 32 so that the lower surface 30 of the elastomeric pad 28 moves away from the upper surface 16 of the integrated circuit 10. A range of motion of about 10 mils is preferred for the heat sink, however, the range could be more or less depending on the application.

In a preferred embodiment of a method according to the present invention, a cooling step is performed on the integrated circuit when the ambient temperature exceeds a threshold level. The cooling step is accomplished with a heat sink 18 held at a distance away from an integrated circuit 10. When the temperature exceeds a threshold level, the heat sink 18 is brought into thermal contact with the integrated circuit 10 as shown in FIG. 2. This cools the integrated circuit 10 and extends the range of ambient temperature for which the integrated circuit 10 remains within its proper operating temperature range. Thermal contact between the heat sink 18 and the integrated circuit 10 is improved with a an elastomeric pad 28, which compensates for surface roughness of the upper surface 16 of the integrated circuit 10 and the surface roughness of the lower surface 26 of the heat sink 18 as shown in FIG. 1.

In an alternate embodiment, the method further includes a heating step. When the temperature drops below a threshold level, heat is applied to the integrated circuit thus elevating its temperature and extending the range of ambient temperatures for which the integrated circuit maintains proper operating temperature. In a preferred embodiment of the invention, heating is performed by a heat pad 50 that is disposed against the upper surface 16 of the integrated circuit 10. The heat pad 50 is coupled to a temperature sensor 54 which activates the heat pad 50 once the temperature drops below a threshold level.

Although specific embodiments of the present invention have been disclosed, it will be understood by those having ordinary skill in the art that changes can be made to those specific embodiments without departing from the spirit and the scope of the invention.

What is claimed is:

1. An apparatus regulating the temperature of an electronic device attached to a base, the apparatus comprising:
    an electronic device attached to a base;
    a heat sink having a surface;
    a temperature dependent loading device, being attached to the heat sink and the base, holding the heat sink at a distance from the electronic device; and
    wherein the temperature dependent loading device forces the heat sink toward the electronic device as the temperature increases, so that when the temperature exceeds a threshold the heat sink thermally contacts the electronic device.

2. The apparatus according to claim 1, wherein the temperature dependent loading device comprises:
    at least one bi-metallic strip having a pair of end portions and a curved portion including a radius between the end portions, one of the end portions being attached to the heat sink, the other end portion being attached to the base thus holding the heat sink at a distance from the electronic device; and
    wherein the radius changes based on temperature and the distance varies with the radius, so that when the temperature exceeds a threshold the heat sink thermally contacts the electronic device.

3. The apparatus according to claim 2, wherein the heat sink includes a finned portion.

4. The apparatus according to claim 2, wherein the base is a printed circuit board.

5. The apparatus according to claim 2, wherein the base is a single chip module.

6. The apparatus according to claim 2, wherein the base is a multiple chip module.

7. The apparatus according to claim 1, wherein the electronic device is an integrated circuit.

8. The apparatus according to claim 1, further comprising a thermally conductive, compressible material disposed against the surface of the heat sink, for thermally contacting the electronic device.

9. The apparatus according to claim 8, wherein the thermally conductive, compressible material is an elastomeric pad.

10. The apparatus according to claim 1, further comprising:
    a heat pad having upper and lower surfaces, the lower surface being in thermal contact with the integrated circuit;
    thermostat means, coupled to the heat pad, activating the heat pad when the temperature drops below a threshold; and
    wherein the heat sink thermally contacts the electronic device through the heat pad when the temperature exceeds a threshold.

11. The apparatus according to claim 10, wherein the heat pad includes:

a conductive element coupled to the thermostat means, disposed within the heat pad producing resistive heating in response to activation by the thermostat means.

12. The apparatus according to claim 11, wherein the heat pad has a thickness in a range of 0.5 mils to 2 mils.

13. A method of regulating the temperature of an electronic device attached to a base comprising the steps of:

supporting a heat sink at a distance from the electronic device with a temperature dependent loading device attached to the base;

reducing the distance until the heat sink moves into thermal contact with the electronic device above a threshold temperature; and increasing the distance until the heat sink moves out of thermal contact with the electronic device below a threshold temperature.

14. The method according to claim 13, wherein an elastomeric pad disposed between the heat sink and the electronic device, facilitates thermal contact between the heat sink and the electronic device.

15. The method according to claim 13, further comprising the step of:

heating the electronic device when the temperature drops below a threshold.

16. The method according to claim 15, wherein the electronic device includes a substantially planar upper surface; and the heating step is performed by a heat pad in thermal contact with the upper surface of the electronic device.

17. The method according to claim 13, wherein the electronic device is an integrated circuit.

18. The method according the claim 13, wherein:

the temperature dependent loading device is a bi-metallic strip;

the reducing step occurs in response to the electronic device heating the bi-metallic strip; and the increasing step occurs in response to the electronic cooling the bi-metallic strip.

19. The method according to claim 18, wherein the bi-metallic strip is thermally insulated from the base.

20. The method according to claim 18, wherein the bi-metallic strip is thermally insulated from the heat-sink.

21. The method according to claim 18, wherein the bi-metallic strip is thermally coupled to the electronic device.

22. The method according to claim 21, wherein the bi-metallic strip is thermally decoupled from the heat sink.

* * * * *